(12) United States Patent
Chachad et al.

(10) Patent No.: US 9,009,408 B2
(45) Date of Patent: Apr. 14, 2015

(54) NON-BLOCKING, PIPELINED WRITE ALLOCATES WITH ALLOCATE DATA MERGING IN A MULTI-LEVEL CACHE SYSTEM

(75) Inventors: Abhijeet Ashok Chachad, Plano, TX (US); Raguram Damodaran, Plano, TX (US); David Matthew Thompson, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 643 days.

(21) Appl. No.: 13/245,178

(22) Filed: Sep. 26, 2011

(65) Prior Publication Data

US 2012/0198161 A1 Aug. 2, 2012

Related U.S. Application Data

(60) Provisional application No. 61/387,283, filed on Sep. 28, 2010.

(51) Int. Cl.
| | | |
|---|---|---|
| G06F 13/00 | (2006.01) |
| G06F 11/10 | (2006.01) |
| G06F 7/483 | (2006.01) |
| G06F 9/30 | (2006.01) |
| H03M 13/35 | (2006.01) |
| H03M 13/29 | (2006.01) |
| H03K 19/00 | (2006.01) |
| G06F 1/32 | (2006.01) |
| H03K 21/00 | (2006.01) |
| G06F 12/02 | (2006.01) |

(52) U.S. Cl.
CPC ............ *G06F 11/1064* (2013.01); *G06F 7/483* (2013.01); *G06F 9/3012* (2013.01); *H03M 13/353* (2013.01); *H03M 13/2903* (2013.01); *H03K 19/0016* (2013.01); *G06F 1/3296* (2013.01); *H03K 21/00* (2013.01); *G06F 12/0246* (2013.01); *Y02B 60/32* (2013.01)

(58) Field of Classification Search
CPC ............ G06F 12/0638; G06F 12/0802; G06F 112/0811
See application file for complete search history.

(56) References Cited

U.S. PATENT DOCUMENTS

| | | | | |
|---|---|---|---|---|
| 6,477,622 | B1 * | 11/2002 | Normoyle et al. | 711/143 |
| 6,718,444 | B1 * | 4/2004 | Hughes | 711/155 |
| 6,728,839 | B1 * | 4/2004 | Marshall | 711/137 |
| 7,689,738 | B1 * | 3/2010 | Williams et al. | 710/52 |
| 8,019,944 | B1 * | 9/2011 | Favor et al. | 711/118 |
| 2007/0050564 | A1 * | 3/2007 | Gunna et al. | 711/146 |
| 2011/0320687 | A1 * | 12/2011 | Belluomini et al. | 711/103 |

* cited by examiner

*Primary Examiner* — Sean D Rossiter
(74) *Attorney, Agent, or Firm* — Robert D. Marshall, Jr.; Frederick J. Telecky, Jr.

(57) ABSTRACT

This invention handles write request cache misses. The cache controller stores write data, sends a read request to external memory for a corresponding cache line, merges the write data with data returned from the external memory and stores merged data in the cache. The cache controller includes buffers with plural entries storing the write address, the write data, the position of the write data within a cache line and unique identification number. This stored data enables the cache controller to proceed to servicing other access requests while waiting for response from the external memory.

4 Claims, 6 Drawing Sheets

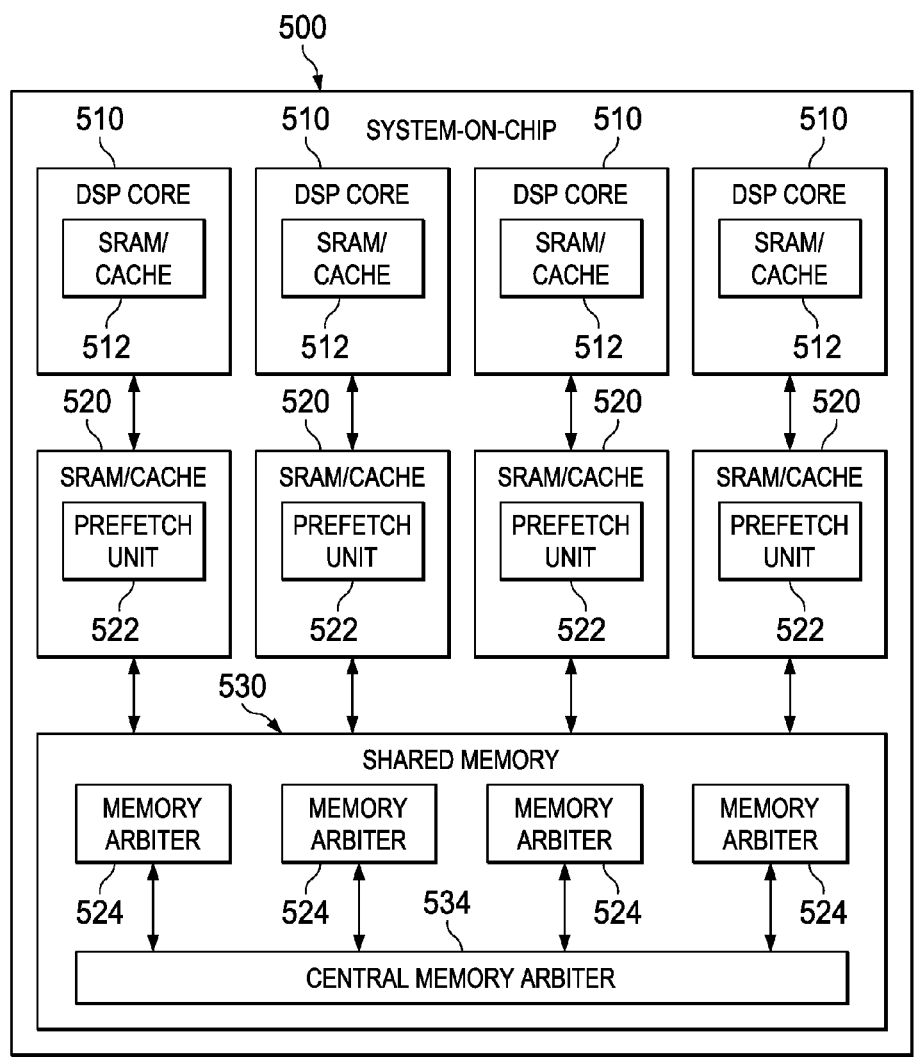

NON-BLOCKING, PIPELINED WRITE ALLOCATES WITH ALLOCATE DATA MERGING IN A MULTI-LEVEL CACHE SYSTEM

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache systems in digital data processors.

BACKGROUND OF THE INVENTION

In a multi-level cache system, write requests from a higher cache level that miss have to commit that data to the intended endpoint. These write are typically cached to improve performance. A write miss is treated like a read. Data is allocated in a cache including the write target address. When the allocated data returns it is stored in the cache. The required write then takes place in the cache. This cache line is then marked dirty.

Prior art solutions stalled the CPU and higher cache levels while this write allocate is processed. The entire cache controller stalled until the cache line had been allocated to the cache. This was highly inefficient. Because the CPU request was a write, this should have been processed without such stalls. The prior art did not pipeline write allocates. The cache controller could process only one allocate. The prior art cache controller had to wait until the allocated line was stored before writing data into the allocated cache line. In addition because this prior art committed the write data to the cache after the allocated line was written, all parity and error detection/correction information was lost. This removed soft error protection for this cache line.

SUMMARY OF THE INVENTION

This invention handles write request cache misses in a manner that does not block the cache from processing further access requests. On a write request generating a cache miss the cache controller stores write data, sends a read request to external memory for a corresponding cache line, merges the write data with data returned from the external memory and stores merged data in the cache.

The cache controller includes buffers with plural entries storing the write address, the write data, the position of the write data within a cache line and unique identification number. This stored data enables the cache controller to proceed to servicing other access requests while waiting for response from the external memory. The read response will typically be in data portions less than an entire cache line. On receipt of a data portion the cache controller determines if this portion encompasses the write data. If so, the write data is merged with this portion and stored in the proper location in the cache. If not, the portion is stored in the proper location in the cache. Upon receipt of all the return data from the external memory, the cache controller releases for reuse the corresponding buffer entries. Since the write data is merged with the newly allocated line in the buffer before being written to the cache, the amount of data being written to the cache is enough to generate parity/error correction syndrome information when the data is written. This enables soft error protection on this data

BRIEF DESCRIPTION OF THE DRAWINGS

These and other aspects of this invention are illustrated in the drawings, in which:

FIG. 4 illustrates the instruction syntax of the very long instruction word digital signal processor core illustrated in FIG. 2 (prior art);

FIG. 5 illustrates a computing system including a local memory arbiter according to an embodiment of the invention;

DETAILED DESCRIPTION OF PREFERRED EMBODIMENTS

Figure 1:
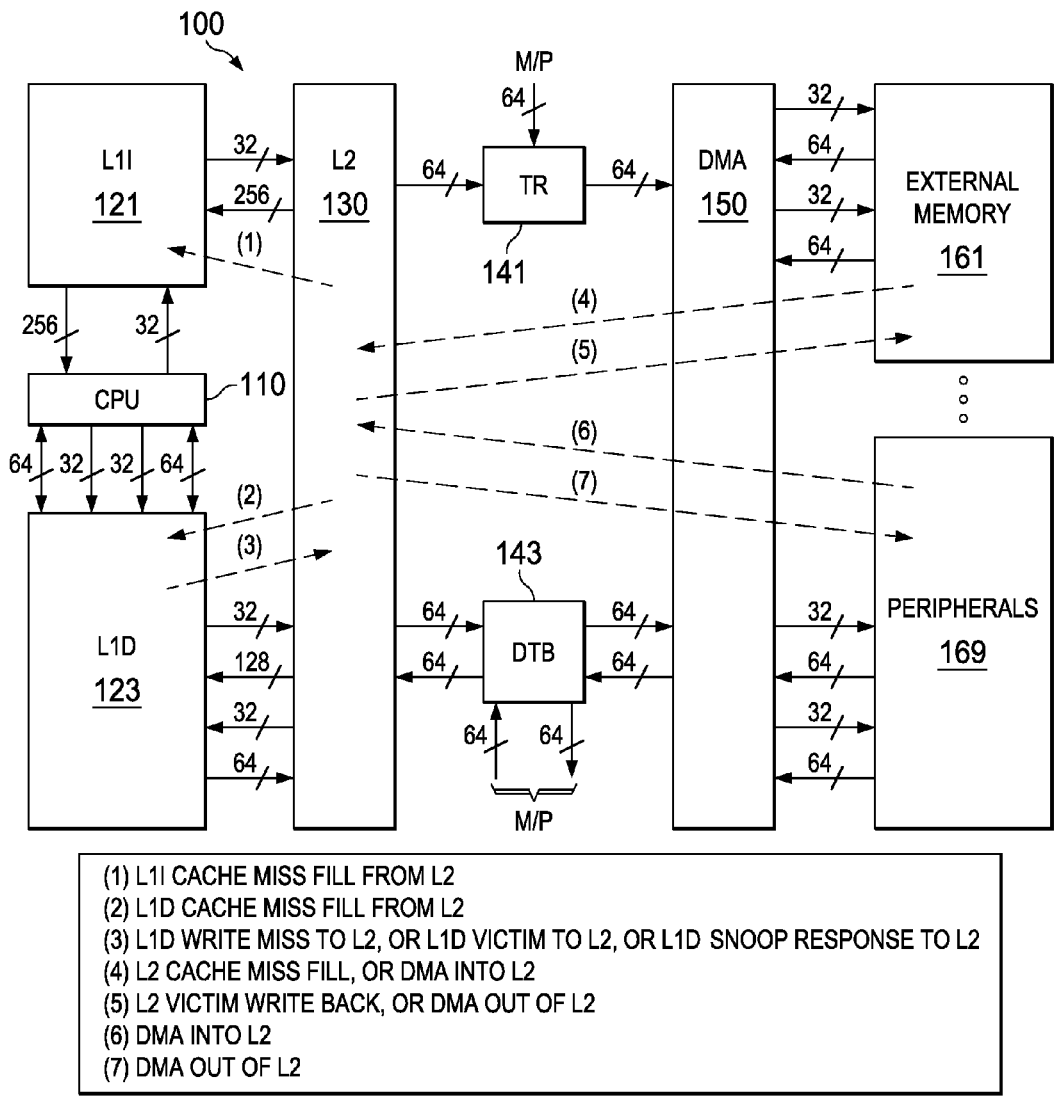
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically includes a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
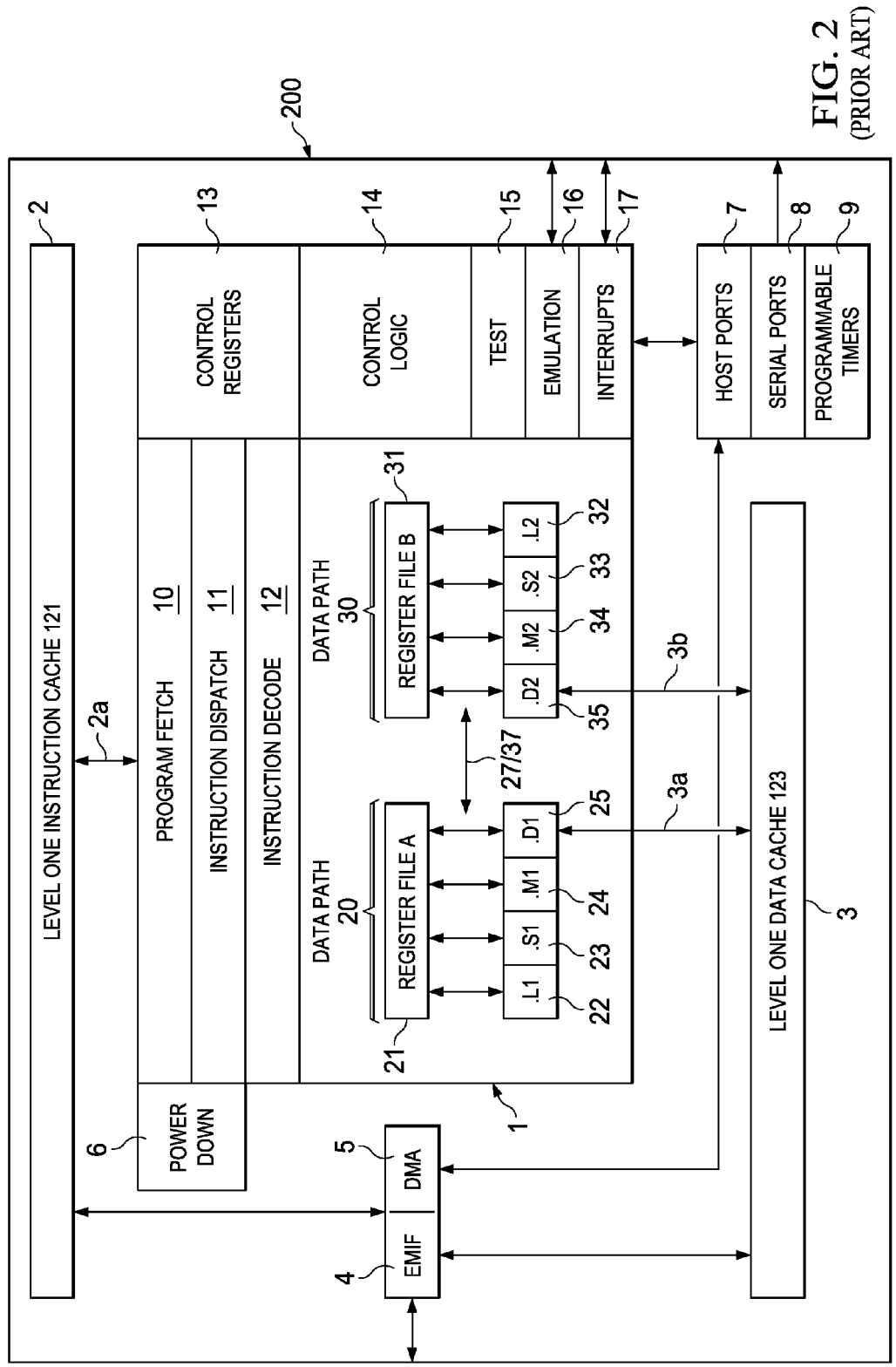
FIG. 2 illustrates details of a very long instruction word digital signal processor core suitable for use in FIG. 1 (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
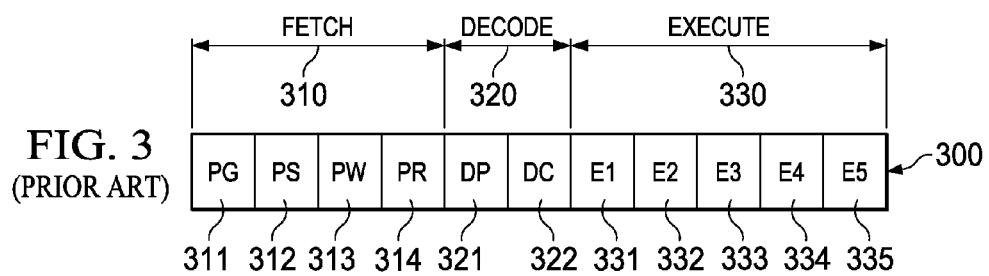
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 is a block diagram illustrating a computing system including a local memory arbiter according to an embodiment of the invention. FIG. 5 illustrates system on a chip (SoC) 500. SoC 500 includes one or more DSP cores 510, SRAM/Caches 520 and shared memory 530. SoC 500 is preferably formed on a common semiconductor substrate. These elements can also be implemented in separate substrates, circuit boards and packages. For example shared memory 530 could be implemented in a separate semiconductor substrate. FIG. 5 illustrates four DSP cores 510, but SoC 500 may include fewer or more DSP cores 510.

Each DSP core 510 preferably includes a level one data cache such as L1 SRAM/cache 512. In the preferred embodiment each L1 SRAM/cache 512 may be configured with selected amounts of memory directly accessible by the corresponding DSP core 510 (SRAM) and data cache. Each DSP core 510 has a corresponding level two combined cache L2 SRAM/cache 520. As with L1 SRAM/cache 512, each L2 SRAM/cache 520 is preferably configurable with selected amounts of directly accessible memory (SRAM) and data cache. Each L2 SRAM/cache 520 includes a prefetch unit 522. Each prefetch unit 522 prefetchs data for the corresponding L2 SRAM/cache 520 based upon anticipating the needs of the corresponding DSP core 510. Each DSP core 510 is further coupled to shared memory 530. Shared memory 530 is usually slower and typically less expensive memory than L2 SRAM/cache 520 or L1 SRAM/cache 510. Shared memory 530 typically stores program and data information shared between the DSP cores 510.

In various embodiments, each DSP core 510 includes a corresponding local memory arbiter 524 for reordering memory commands in accordance with a set of reordering rules. Each local memory arbiter 524 arbitrates and schedules memory requests from differing streams at a local level before sending the memory requests to central memory arbiter 534. A local memory arbiter 524 may arbitrate between more than one DSP core 510. Central memory arbiter 534 controls memory accesses for shared memory 530 that are generated by differing DSP cores 510 that do not share a common local memory arbiter 524.

Figure 6:
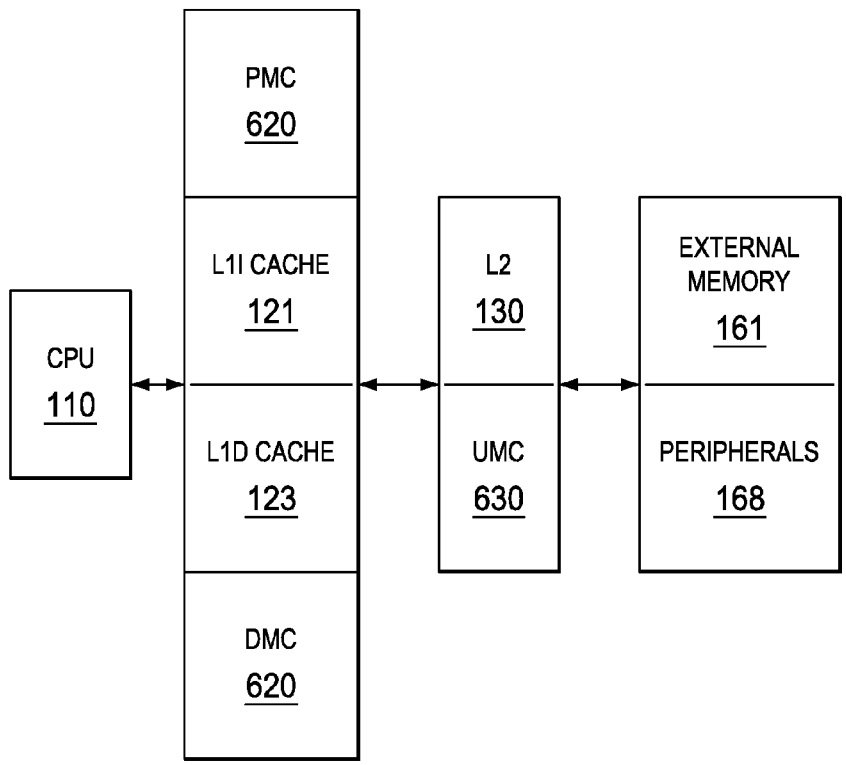
FIG. 6 is a further view of the digital signal processor system of this invention showing various cache controllers.

FIG. 6 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is controlled by data memory controller (DMC)

610. Data transfers into and out of L1I cache 121 is controlled by program memory controller (PMC) 620. Data transfers into and out of L2 130 including both cache and directly addressable memory (SRAM) are controlled by unified memory controller (UMC) 630. This application is primarily concerned with level 2 cache and UMC 630.

Figure 7:
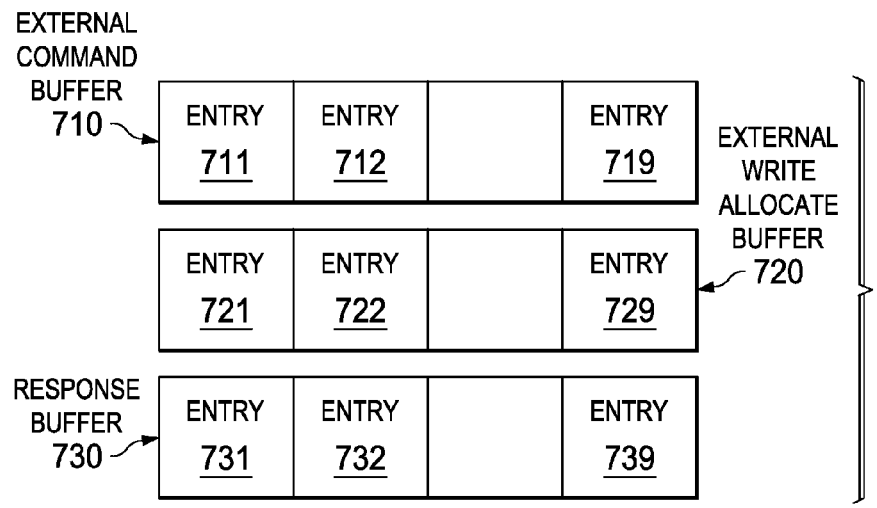
FIG. 7 illustrates buffers used in the write allocation of this invention.

FIG. 7 illustrates buffers used in the write allocation of this invention. FIG. 7 illustrates three buffer types. The left of the drawing corresponds to an internal bus to L1I cache 121 and L1D cache 123 and the right of the drawing corresponds to an external bus to external memory 161.

External command buffer 710 is first type of buffer. External command buffer 710 includes plural entries 711, 712 to 719. External command buffer 710 holds commands from UMC 630 to read data in or write data out to an external endpoint. Each CPU transaction uses one entry irrespective of the size of the read/writes or whether it is an allocate or not.

Figure 8:
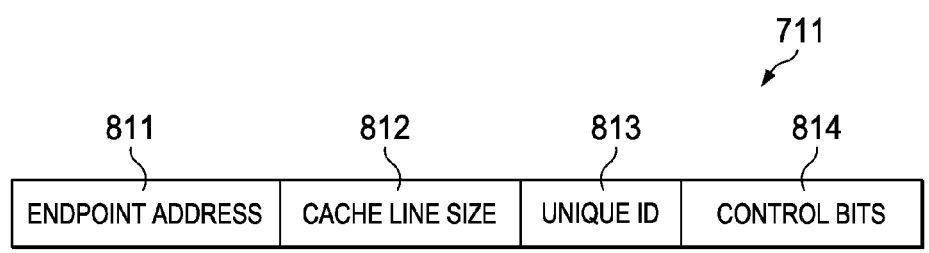
FIG. 8 illustrates the contents of an exemplary external command buffer entry.

FIG. 8 illustrates the contents of an exemplary external command buffer entry 711. External command buffer entry 711 holds information on the endpoint address in field 811, the cache line size in field 812, a unique transaction identification number in field 813 and other control data used by the memory interface in field 814.

External write allocate buffer 720 is the second type buffer. External write allocate buffer 720 includes plural entries 721, 722 to 729. External write allocate buffer 720 holds the write allocate data. Write allocates operate as fire and forget. Thus write allocates are issued by UMC 630, but the controller does not stall waiting for the write allocate to finish. Data from this buffer is merged with the data returned from the endpoint.

Figure 9:
FIG. 9 illustrates the contents of an exemplary external write allocate buffer entry.

FIG. 9 illustrates the contents of an exemplary external write allocate buffer entry 721. External write allocate buffer entry 721 stores the write data that triggered the write allocate in field 921. This write data is used when the allocate completes. External write allocate buffer 721 stores a unique transaction identification number in field 922. This unique transaction identification number corresponds to the unique transaction identification number in external command buffer 711 for the same transaction.

Response buffer 730 is the third type buffer. Read response buffer 730 includes entries 731, 732 to 739. Read response buffer 730 holds information corresponding to read data returned from the endpoint. External read response buffer 730 does not hold the actual data, but information such as CPU address, allocate way, byte position for write allocate and the number of data phases needed by the level PMC 610 or DMC 620.

Figure 10:
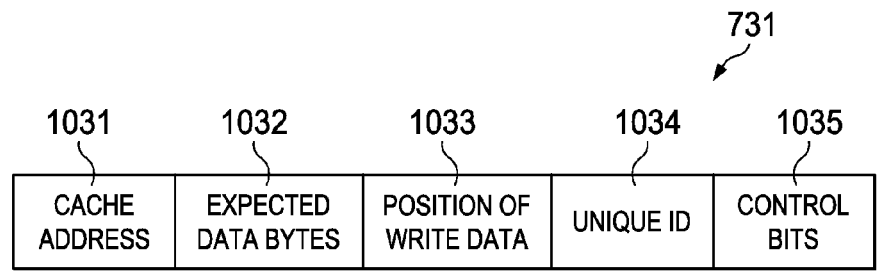
FIG. 10 illustrates the contents of an exemplary response buffer entry.

FIG. 10 illustrates the contents of an exemplary response buffer entry 731. Response buffer entry 731 stores instructions on how to process the allocate data when it returns. This includes the cache address in field 1031, the number of data bytes expected in field 1032, the position of the write allocate data in field 1033, a unique transaction identification number in field 1034 and other control information in field 1035. The unique transaction identification number in field 1034 corresponds to the unique transaction identification number in external command buffer 711 for the same transaction.

In this invention a write access from the higher level cache that misses is write allocated. Write allocation recalls data corresponding to the write access for storage within the cache. Such a write allocate is a multi-step process. In the prior art a write allocate would take many cycles creating long stalls to the CPU. This invention prevents those stalls and increases the performance of write allocates.

Figure 11:
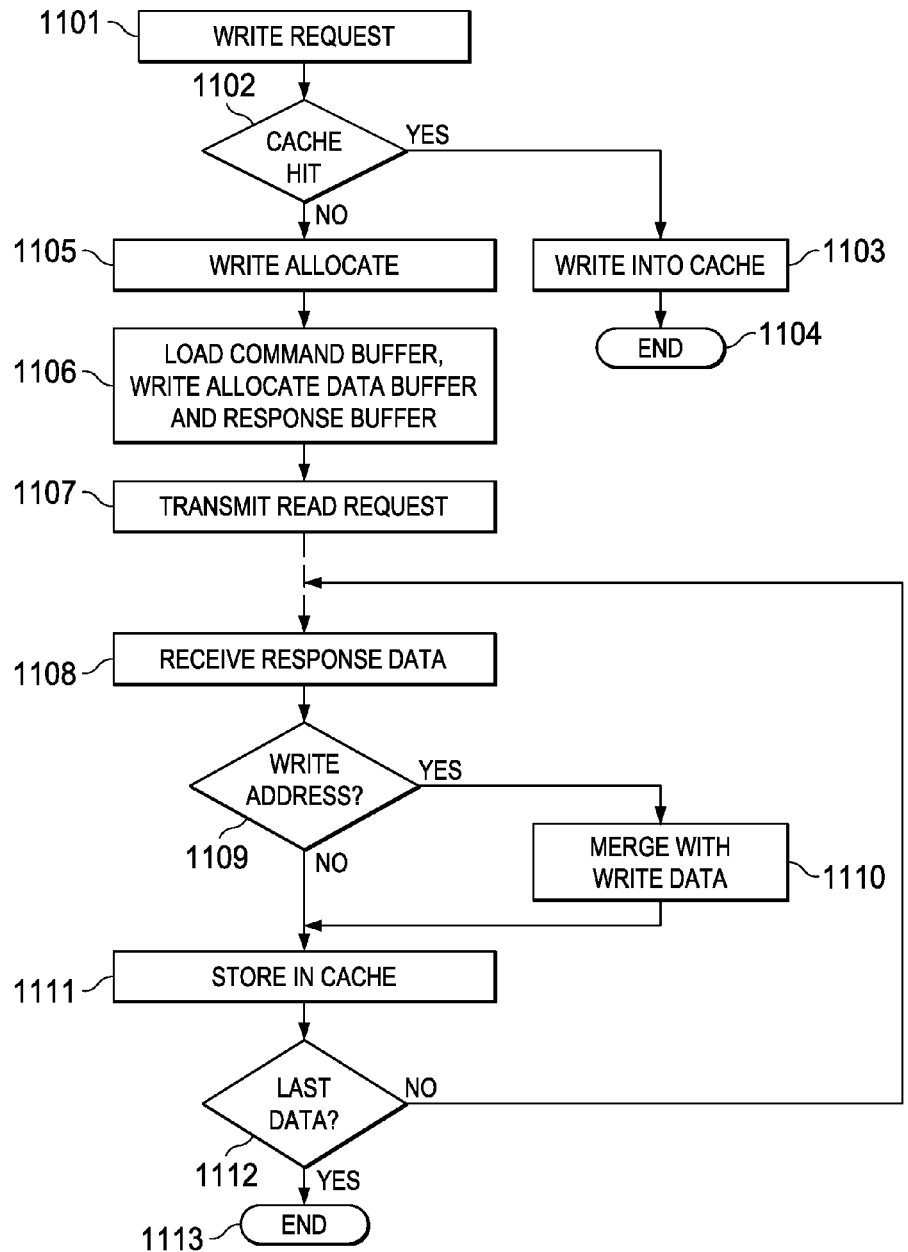
FIG. 11 is a flow chart illustrating the process of the write allocate of this invention.

FIG. 11 is a flow chart illustrating the process of the write allocate of this invention. The process begins with a write request in block 1101. This write request comes from DMC 610 based upon a cache miss within L1D cache 123. The preferred embodiment of this invention does not support writes into L1I cache 121.

Test block 1102 determines whether the address of this write request causes a hit within L2 cache 130. If this write request generates a hit (Yes in test block 1102), then this write is performed into the L2 cache 123 entry (block 1103). This completes the write process (block 1104).

If this write request does not generate a hit (No in test block 1102), then block 1105 generates a write allocate. This requires data to be recalled from the base memory, such as external memory 161, and the write performed in the cache. Block 1106 loads the command buffer, the write allocate data buffer and the response buffer with data corresponding to the write request. UMC 630 generates a unique transaction identification number to mark the corresponding entries in these buffers. The write request then creates a read allocate (block 1107). UMC 630 transmits a read request to the endpoint such as external memory 161 to recall the entire cache line for storing in L2 cache 130. Such a read allocate is single cycle process. All the information needed for this read allocate is stored in buffers. UMC 630 treats this as a fire and forget request similar to a write to the endpoint, except UMC 630 processes it as an allocate. UMC 630 having loaded the buffers with the required data is released to service other requests. Thus UMC 630 creates an allocate having no impact different than sending a write to the endpoint. As noted below completion of the write allocate is controlled by an autonomous state machine operating on data and parameters stored in the buffers. Thus neither CPU 110 nor other cache levels stall during this time. This state machine executes the following steps.

This UMC 630 state machine waits for return data from the external memory 161 as evidenced by the dashed line between blocks 1107 and 1108. In block 1108 data returns from external memory 161. The data size of this return data depends upon the bus connection between L2 cache 130 and external memory 161. In particular it is generally expected that several portions of return data will be required to fill a L2 cache line. Block 1108 operates upon each return of a portion of this data.

When allocate data starts arriving, the state machine uses the unique transaction identification to identify the corresponding entries in the buffers. Test block 1109 determines if the just received return data encompasses the write data. Field 1033 of response buffer entry 731 identifies the location of the write data within the requested cache line. If the just received data encompasses the write data (Yes in test block 1109), then the write data stored in the write allocate data buffer entry 721 field 921 is merged into the return data (block 1110). Following this merge or if the just received data does not encompass the write data (No in test block 1109), then the return data or merged return data and write data is stored in the cache (block 1111). Note the response buffer entry 731 includes cache address data (field 1031) to enable computation of the physical address of the cache.

Test block 1112 determines if the just received return data is the last return data. The expected data bytes field 1030 of response buffer entry 731 enables this determination. If the just received return data is the last return data (Yes at test block 1112), then the write allocate process ends at block 1113. The corresponding buffer entries in external command buffer 710, external write allocate data buffer and response buffer 703 are released for reuse. If the just received return data is not the last return data (No at test block 1112), then flow returns to block 1108 to wait for the next return data.

This invention advantageously uses write allocate data merging. In the prior art when the allocate data is committed to the cache, the cache controller would wait for it to complete and then commit the write allocate data as an additional write access to the cache. In this invention, the write data is merged at the correct byte position and written while the allocate data is being committed to the cache. This avoids an extra write at the end of the allocate. The absence of this final write operation of the prior art reduces power consumption in writing to the cache.

This invention avoids protection errors. The manner of storing the return data and the write data in the cache enables calculation of parity and/or error detection/correction bits during the write to the cache. This preserves soft error protection in the cache.

Prior art solutions stalled the CPU and higher cache levels while the write allocate processed. The entire cache controller stalled until the entire cache line had been allocated to the cache. This was highly inefficient. Because the CPU request was a write, this should have been processed without such stalls. The prior art did not pipeline write allocates. The cache controller could process only one allocate due to a lack of buffers. The prior art did not merge write allocate data. Thus the cache controller had to wait until the entire allocated line was stored and the write data was written into the allocated cache line.

The multiple buffers of this invention make it possible for the cache controller to save the command to the buffers and unstall the cache pipeline. Allocations are pipelined. The write allocate data is saved in buffers. This makes it possible for the cache controller to process multiple write allocates. Write allocate data merging avoids the extra write. These changes make it possible for the cache controller to treat the write as a single-cycle transaction and retain all the performance improvements that come with caching the write while avoiding any impact of this caching.

What is claimed is:

1. A data processing system comprising:
a central processing unit executing program instructions to manipulate data;
a cache connected to said central processing unit temporarily storing in a plurality of cache lines data for manipulation by said central processing unit; and
a cache controller connected to said cache including
a command buffer including a plurality of entries, each entry storing a write address and a corresponding unique identification number,
a write data buffer having a plurality of entries, each entry temporarily storing write data and a corresponding unique identification number, and
a response buffer having a plurality of entries, each entry storing a position of said write data within said cache line of data encompassing said write request and a corresponding unique identification number;
said cache controller operable on a write request generating a cache miss to
store write data corresponding to said write request in a next write data buffer entry,
send a read request to an external memory for a cache line of data encompassing said write request, the external memory returning data in sequential portions less than all of said cache line of data encompassing said write request,
match said data returned from the external memory with corresponding write data stored in an entry in said write data buffer using said unique identification number,
upon receipt of one of said sequential portions from the external memory, determine if said sequential portion encompasses said write data from said position of said write data,
if said sequential portion does not encompasses said write data, store said sequential portion in a corresponding location within said cache, and
if said sequential portion encompasses said write data, merge said write data with said sequential portion and store said merged data in a corresponding location within said cache.

2. The data processing system of claim 1, wherein:
each entry of said response buffer storing an amount of data expected from the external memory in response to said read request; and
said cache controller is further operable to
following receipt of each of said sequential portions, determine if said sequential portion is a last sequential portion from said corresponding amount of data expected, and
release for reuse entries in said command buffer, said write data buffer and said response buffer identified by a corresponding unique identification number following storing data in said cache corresponding to said last sequential portion.

3. The data processing system of claim 1, wherein:
said cache controller is further operable to control plural write requests simultaneously.

4. A data processing system comprising:
a central processing unit executing program instructions to manipulate data;
a cache connected to said central processing unit temporarily storing in a plurality of cache lines data for manipulation by said central processing unit; and
a cache controller connected to said cache including
a command buffer including a plurality of entries, each entry storing a write address and a corresponding unique identification number,
a write data buffer having a plurality of entries, each entry temporarily storing write data and a corresponding unique identification number, and
a response buffer having a plurality of entries, each entry storing a position of said write data within said cache line of data encompassing said write request and a corresponding unique identification number;
said cache controller operable on a write request generating a cache miss to
store write data corresponding to said write request in a next write data buffer entry, and
send a read request to an external memory for a cache line of data encompassing said write request;
said cache controller operable on sending a read request to the external memory in response a write request generating a cache miss to service other cache requests pending receipt of data from the external memory;
said cache controller operable on receipt of data from the external memory corresponding a write request generating a cache miss to
match said data returned from the external memory with corresponding write data stored in an entry in said write data buffer using said unique identification number,
merge said write data stored in said write buffer with said cache line of data returned from the external memory in response to said read request, and store said merged cache line of data in a corresponding cache line in said cache.

\* \* \* \* \*